(12) United States Patent
Juang et al.

(10) Patent No.: US 8,766,525 B2
(45) Date of Patent: *Jul. 1, 2014

(54) NITRIDE PHOSPHOR AND MANUFACTURING METHOD THEREOF, AND LIGHT EMITTING DEVICE USING THE SAME

(75) Inventors: Yuan Ren Juang, Tainan (TW); Jen-Shrong Uen, Tainan (TW)

(73) Assignee: Chi Mei Corporation, Tainan (TW)

( * ) Notice: Subject to any disclaimer, the term of this patent is extended or adjusted under 35 U.S.C. 154(b) by 60 days.

This patent is subject to a terminal disclaimer.

(21) Appl. No.: 13/606,427

(22) Filed: Sep. 7, 2012

(65) Prior Publication Data

US 2012/0326593 A1 Dec. 27, 2012

Related U.S. Application Data

(63) Continuation of application No. 13/215,023, filed on Aug. 22, 2011, now Pat. No. 8,288,934.

(30) Foreign Application Priority Data

Apr. 1, 2011 (TW) .............................. 100111586 A (51) Int. Cl.
- *C09K 11/78* (2006.01)
- *C09K 11/79* (2006.01)
- *C09K 11/80* (2006.01)
- *H01J 1/63* (2006.01)

(52) U.S. Cl.
USPC ..................... 313/483; 313/498; 252/301.4 R (58) Field of Classification Search
USPC ......... 313/498–512; 445/23–24; 252/301.4 F
See application file for complete search history.

(56) References Cited

U.S. PATENT DOCUMENTS

| 7,262,439 | B2 | 8/2007 | Setlur et al. | |
|---|---|---|---|---|
| 7,812,345 | B2 * | 10/2010 | Yoshida et al. | 257/40 |
| 8,288,934 | B2 * | 10/2012 | Juang et al. | 313/483 |
| 2007/0007494 | A1 | 1/2007 | Hirosaki et al. | |
| 2007/0114548 | A1 * | 5/2007 | Setlur et al. | 257/98 |

FOREIGN PATENT DOCUMENTS

| JP | 3837588 | 10/2006 |
|---|---|---|
| JP | 2007-231245 | 9/2007 |
| JP | 2009-516774 | 4/2009 |

OTHER PUBLICATIONS

Japanese language office action dated Mar. 21, 2012.

* cited by examiner

*Primary Examiner* — Tracie Y Green (74) *Attorney, Agent, or Firm* — McClure, Qualey & Rodack, LLP (57) ABSTRACT

A phosphor and a manufacturing method thereof, and the light emitting device using the same are provided, wherein the composition formula of the phosphor is $I_i$-$M_m$-$A_a$-$B_b$—$O_t$—$N_n$:$Z_r$, wherein I is selected from the group consisting of Li, Na, and K, M is selected from the group consisting of Ca, Sr, Mg, Ba, Be, and Zn, A is selected from the group consisting of Al, Ga, In, Sc, Y, La, Gd, and Lu, B is selected from the group consisting of Si, Ge, Sn, Ti, Zr, and Hr, and Z is selected from the group consisting of Eu and Ce; m+r=1, $0<i<0.25$, $0<a<1$, $0<b<2$, $1.15<b/a<1.4$, $0\le t\le 0.7$, $2.1\le n\le 14.4$, and $0.001\le r\le 0.095$.

17 Claims, 4 Drawing Sheets

NITRIDE PHOSPHOR AND MANUFACTURING METHOD THEREOF, AND LIGHT EMITTING DEVICE USING THE SAME

This is a continuation application of co-pending application Ser. No. 13/215,023, filed Aug. 22, 2011, which claims the benefit of Taiwan application Serial No. 100111586, filed Apr. 1, 2011, the contents of which are incorporated herein by reference.

BACKGROUND OF THE INVENTION

1. Field of the Invention

The invention relates in general to a novel phosphor having high brightness and durability, a method for making the phosphor, a phosphor manufactured using the method, and particularly a red phosphor emitting light with wavelength of red light when excited and the applications related to devices such as displays or light-emitting diodes. The invention also provides a light emitting device comprising the red phosphor.

2. Description of the Related Art

By the demands of energy conservation and environmental protection, developing illumination light sources being highly efficient and energy saving and conforming to the environmental protection needs has become an important research topic. In particular, white light-emitting diodes (LED) have further become an important technology to replace the traditional illumination lamps, because they have the advantages of small volumes, low heat generation, low electricity consumption, long lifetime, and etc., and do not have the drawbacks of high electricity consumption and fragility of incandescent lamps and mercury contamination of wastes from fluorescent lamps. At present, the white light-emitting devices used for illumination are mostly using blue light as the exciting light source to collocate with yellow phosphors as the main trend. However, the white light emitted from the above-mentioned white light-emitting device is less sufficient in the red light wavelength region, such that the color rendering property and color saturation of the white light is evidently insufficient. In addition, the conventional yellow phosphor has poor illumination efficiency which makes white light having poor brightness. In order to solve the above-mentioned problems, in recent years, there have been constructive developments to mix phosphors capable of emitting red light into yellow phosphors to improve the color rendering property and color saturation of white light, and the red phosphor can be utilized to compensate the drawback of low illumination efficiency of yellow phosphor.

The known red phosphor for now, such as $Sr_2Si_5N_8$:Eu, $CaAlSiN_3$:Eu or sialon phosphor (represented by a general formula $M_zSi_{12-(m+n)}Al_{m+n}O_nN_{16-n}$). However, due to the low heat tolerance of the crystal of the phosphor $Sr_2Si_5N_8$:Eu, it suffers from the drawback of the decrease of brightness and the color rendering property after a long-term use. Although sialon phosphor does not have problems related to durability, of which the luminous brightness is evidently insufficient, therefore, it is not popularly used for commercial applications. Although phosphor $CaAlSiN_3$:Eu has a nice durability and a nice brightness compared to sialon phosphor, the industry is still looking forward to phosphors with higher brightness, making light emitting devices having higher illumination efficiency than those of the known phosphor.

The luminous brightness, of the red phosphors of $CaAlSiN_3$:Eu such as $Ca_mAl_aSi_bN_n$:$Eu_z$ in which (m+z):a:b:n=1:1:1:3, can be increased by the addition of alkali metals. However, the improvement range for the actual brightness is not large. In addition, the retention rate of the brightness of phosphors is evidently decreased. Therefore, the effect of the improvement is poor, and the optimization effect is not realized, such that the actually industry needs can not be satisfied.

Besides, the composition of red phosphors of $CaAlSiN_3$:Eu has been adjusted, for example, Al/Si is adjusted to be larger than 1. Although the luminous brightness of phosphors can be increased, the retention rate of the brightness shows a trend of obvious decrease. Therefore, the luminous brightness is difficult to be substantially increased.

According to the above discussion, there is still a need for developing a red phosphor which has higher brightness and higher durability compared to the red phosphors of the current technology, and of which the practicability and the color rendering property of the white light can be increased in the sequent applications.

SUMMARY OF THE INVENTION

The object of the invention is directed to a phosphor with high brightness and high durability.

The phosphor is represented by a composition formula $I_i$-$M_m$-$A_a$-$B_b$—$O_t$—$N_n$:$Z_r$, wherein I is selected from the group consisting of Li, Na, and K, M is selected from the group consisting of Ca, Sr, Mg, Ba, Be, and Zn, A is selected from the group consisting of Al, Ga, In, Sc, Y, La, Gd, and Lu, B is selected from the group consisting of Si, Ge, Sn, Ti, Zr, and Hr, and Z is selected from the group consisting of Eu and Ce; m+r=1, 0<i<0.25, 0<a<1, 0<b<2, 1.15<b/a<1.4, 0≤t≤0.7, 2.1≤n≤4.4, and 0.001≤r≤0.095.

Moreover, in the phosphor of the invention, it is preferably that 1.25<b/a<1.4.

Moreover, in the phosphor of the invention, it is more preferably that 0.001≤i≤0.2.

Moreover, in the phosphor of the invention, the phosphor further belongs to monoclinic system, wherein element M comprises, for example, elements Ca and Sr.

Moreover, in the phosphor of the invention, element Sr is contained in the amount of more than 20% of the element M.

Moreover, in the phosphor of the invention, it is that a+0.5i=1.

Moreover, in the phosphor of the invention, it preferably that 0.1≤t≤0.7.

Moreover, in the phosphor of the invention, M is selected from the group consisting of Ca and Sr, A at least comprises Al, B at least comprises Si, and Z at least comprises Eu.

Besides, in the phosphor of the invention as above-mentioned, when excited, the CIE 1931 chromaticity coordinates (x, y) of the light emitted from the phosphor is 0.45≤x≤0.72 and 0.2≤y≤0.5.

The second object of the invention is directed to a manufacturing method for a phosphor with high brightness and high durability.

The manufacturing method for a phosphor with high brightness and high durability comprises the following steps: a weighing step to weigh raw materials; a mixing step to mix the raw materials to obtain a mixture; a sintering step to sinter the mixture in a high temperature furnace to obtained a sintered product; and a pulverizing step to pulverize the sintered product and obtain the phosphor; wherein the mixture comprises alkali metal compounds. The raw materials can comprise, for example, alkali metal carbonates. In fact, the raw materials can comprise lithium carbonate or potassium carbonate. Besides, the in the sintering step, the above-mentioned mixture can be sintered under a pressure of 1 atm, and the temperature is ranged from 1600~1800° C., wherein, the temperature is ranged preferably from 1700~1800° C.

The third object of the invention is directed to a light emitting device with high luminous brightness and high practicability and durability, which comprises a light emitting unit of a light emitting element and the above-mentioned phosphor. The light emitting element emits light with a wavelength of, for example, 300~550 nm.

The effect of the present invention is by adjusting the ratio of each element in the composition for effectively combining the elements to form a phosphor with high brightness and high durability. In particular, in the present invention, by adding alkali metal element(s), adjusting the ratio of other elements, and controlling the addition content of alkali metal(s) to a proper range, the obtained phosphor has high brightness and high durability, so that the characteristics of high brightness and high durability of the phosphor of the invention is beyond that of the phosphors of the current technology, and the phosphor is contributive to increase the color rendering property and color saturation of light emitting devices for providing the industry as another choice. Therefore, the effect of the invention is actually achieved.

DETAILED DESCRIPTION OF THE INVENTION

The above and other technical contents, characteristics and effects of the invention will be illustrated with regard to the following detailed description.

A phosphor of the invention is represented by a composition formula $I_i$-$M_m$-$A_a$-$B_b$—$O_t$—$N_n$:$Z_r$. I is selected from the group consisting of Li, Na, and K. M is selected from the group consisting of Ca, Sr, Mg, Ba, Be, and Zn. A is selected from the group consisting of Al, Ga, In, Sc, Y, La, Gd, and Lu. B is selected from the group consisting of Si, Ge, Sn, Ti, Zr, and Hr. Z is selected from the group consisting of Eu and Ce. m+r=1. $0<i<0.25$. $0<a<1$. $0<b<2$. $1.15<b/a<1.4$. $0≤t≤0.7$. $2.1≤n≤4.4$. $0.001≤r≤0.095$.

I is selected from the group consisting of Li, Na, and K. For example, I can be independently element Li, and also can be a mixture of elements Li, Na, and etc. The following is taken element Li as an example to illustrate the source of the element, which can be lithium metal, lithium nitride, lithium carbonate, lithium oxide, lithium silicide, and etc. In embodiments, lithium carbonate provides a preferable effect.

M is selected from the group consisting of Ca, Sr, Mg, Ba, Be, and Zn. For example, M can be independently element Ca, and also can be a mixture of elements Ca, Sr and etc. The following is taken element Ca as an example to illustrate the source of the element, which can be calcium metal, calcium nitride, calcium carbonate, calcium oxide, calcium hydroxide, and etc.

Preferably, M comprises elements Ca and Sr at the same time. Preferably, Sr is contained in the amount of more than 20% of the element M. More preferably, Sr is contained in the amount of more than 35% of the element M. The sources of elements Ca and Sr are not limited and can be various types, which means that the sources of the two elements can be of the same type of compounds or of different types of compounds.

For example, calcium nitride can be used with strontium nitride, or calcium metal can be used with strontium nitride, and etc.

A is selected from the group consisting of Al, Ga, In, Sc, Y, La, Gd, and Lu. For example, A can be independently element Al, and also can be a mixture of elements Al, Ga and etc. The following is taken element Al as an example to illustrate the source of the element, which can be aluminum metal, aluminum nitride, aluminum oxide, lithium hydroxide, and etc. In embodiments, aluminum nitride provides a preferable effect. In addition, aluminum oxide can be used as the source for both Al and O in the phosphor composition.

B is selected from the group consisting of Si, Ge, Sn, Ti, Zr, and Hr. For example, B can be independently element Si, and also can be a mixture of elements Si, Ga and etc. The following is taken element Si as an example to illustrate the source of the element, which can be element Si, silicon nitride, silicon oxide, silicon metal, and etc. In embodiments, silicon nitride provides a preferable effect. Besides, silicon oxide can be used as the source for both Si and O in the phosphor composition.

Z is selected from the group consisting of Eu and Ce. The following is taken element Eu as an example to illustrate the source of the element, which can be element Eu, europium nitride, europium oxide, europium hydroxide, and etc. In embodiments, europium oxide provides a preferable effect. In addition, europium oxide can be used as the source for Eu and O in the phosphor composition.

O is element O, and N is element N.

In the composition formula $I_i$-$M_m$-$A_a$-$B_b$—$O_t$—$N_n$:$Z_r$, $0<i<0.25$, $0<a<1$, $0<b<2$, m+r=1, $1.15<b/a<1.4$, $0≤t≤0.7$, $2.1≤n≤4.4$, $0.001≤r≤0.095$;

Wherein:

I is preferably $0<i<0.25$, more preferably $0.001≤i≤0.2$, and most preferably $0.001≤i≤0.15$;

m+r=1, $1.15<b/a<1.4$;

m is preferably $0<m≤0.999$, and most preferably $0<m≤0.992$;

a is preferably $0<a<1$, more preferably $0.5<a<0.99$, and most preferably $0.9<a<0.96$; More preferably, when A is Al, luminous brightness is more preferable;

b is preferably $0<b<2$, more preferably $1<b<2$, and most preferably $1<b<1.5$;

More preferably, when B is Si, luminous brightness is more preferable;

Preferably, $1.15<b/a<1.4$, and more preferably, $1.25<b/a<1.4$;

t is preferably $0≤t≤0.7$, and more preferably $0.1≤t≤0.7$;

n is preferably $2.1≤n≤4.4$, and more preferably $2.1≤n≤4.0$;

When I, m, a, b, and t are within the above-mentioned range of the invention, luminous brightness is good;

r is preferably $0.001≤r≤0.095$; more preferably, when element Z is Eu, luminous brightness is preferable; when r is smaller than 0.001, due to the small amount of Eu of the illumination center, luminous brightness is decreased; when r is larger than 0.095, due to the interference between the Eu atoms causing a phenomenon of concentration quench, brightness is therefore decreased. More preferably, when r is from 0.002~0.03, luminous brightness is more preferable.

Figure 2:
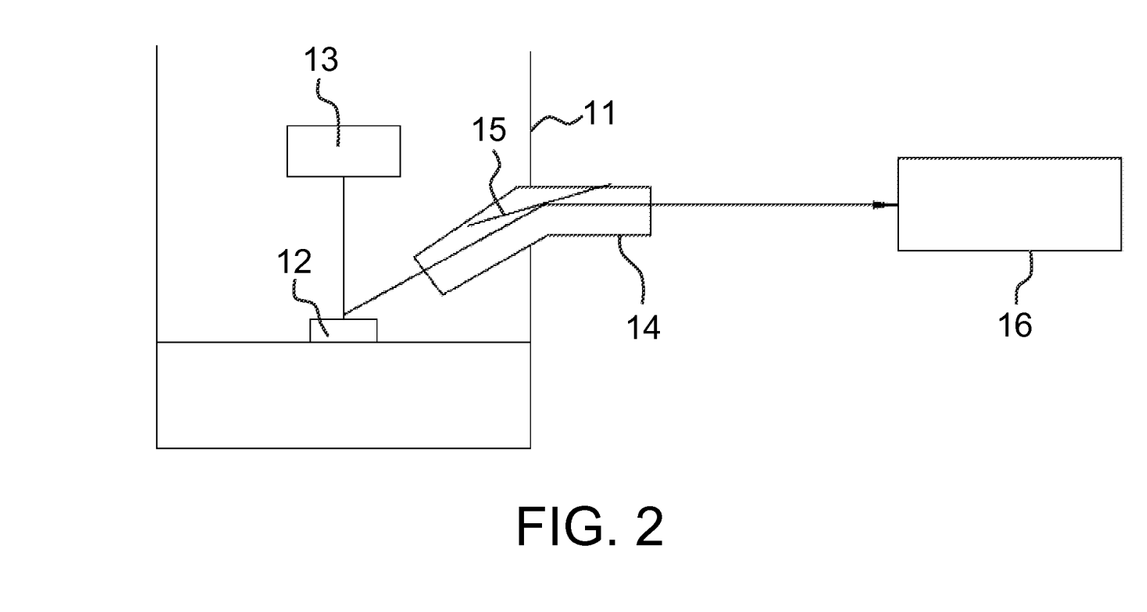
FIG. 2 shows a schematic diagram of a brightness measuring device in usage condition.

Referring to FIG. 2, the brightness of the phosphor of the invention can be detected by using a brightness measuring device. The brightness measuring device comprises a black box body 11, a sample holder 12, a light source 13, a light guide tube 14, a reflective mirror 15, and a brightness meter 16 (TOPCON, SR-3A). The sample holder 12 is disposed in the box body 11, the light source 13 is disposed perpendicular to and about 5 cm higher than the sample holder 12. The light guide tube 14 has a diameter of about 2 cm and is disposed with an angle of 45° with respect to the light source 13. The reflective mirror 15 is disposed in the light guide tube 14 with a gap distance of about 8 cm from the sample holder 12. In addition, the distance between the brightness meter 16 and the reflective mirror is about 40 cm. When the sample holder 12 is filled with phosphor(s) and illuminated by the light source 13, the fluorescence emitted by the phosphor(s) will be guided to the brightness meter 16 via the function of the light guide tube 14 and the reflective mirror 15, and then the brightness and chromaticity of the fluorescence emitted by the phosphor(s) after illuminated by the light source can be detected by suing field 1° mold.

The present invention includes a manufacturing method for the phosphor. The method comprises: a weighing step to weigh raw materials; a mixing step to mix the raw materials to obtain a mixture; a sintering step to sinter the mixture in a high temperature furnace to obtain a sintered product; and a pulverizing step to pulverize the sintered product and obtain the phosphor. The mixture comprises alkali metal compounds. Preferably, the alkali metal compounds comprise alkali metal carbonates, such as lithium carbonate, potassium carbonate, and etc.

The purity of each of the ingredients in the raw materials is higher the better, preferably higher than 2N, and more preferably higher than 3N (99.9%). In order to obtain the phosphor with high brightness, the impurity in the raw materials or the contamination in the treating process should be as minimized as possible. Especially when elements Fe, Co, Ni, F, B, Cl, or C are existent in a large amount, the illumination efficiency of the phosphor will be inhibited. Therefore, choosing raw materials with high purity and controlling the synthesis steps can prevent contamination, such that the content of each of the elements Fe, Co, Ni, F, B, Cl, or C can be lower than 1000 ppm, respectively.

With the various particle sizes and shapes of each of the ingredients in the raw materials, the particle sizes and shapes of the obtained phosphor will vary. As such, there is no restriction for the particle sizes of each of the ingredients in the raw materials, as long as the finally obtained phosphor conform the desired particle size. Preferably, from the promoting reaction point of view, the particle sizes of each of the ingredients in the raw materials are mainly microparticles.

Since each of the ingredients in the raw materials is easily effected by moisture and easily oxidized, it would be more appropriate that, weighing and mixing each of the ingredients (such as $Ca_3N_2$, $Sr_3N_2$, and etc.) in the raw materials need to be operated in a glove box under a non-reactive atmosphere, and the non-reactive atmosphere is preferably sufficiently de-moisturized gaseous. The mixing of the raw materials can be a dry process (such as dry ball milling) or a wet process (such as wet ball milling) and is not restricted to a single type of process. In addition, the mixing device can be a conventional device, such as a ball mill machine or a mortar.

There are no special restrictions for the sintering treatment, and the goal is to introduce the sintering container with the raw materials therein into a non-oxidized atmosphere and to be heated, so that the raw materials can react and form a phosphor. Preferably, a normal pressure process is adopted. There are no special restrictions for the heating process of the sintering treatment. Preferably, the heating process is selected from metal resistive heating, graphite resistive heating, or the combination thereof. The sintering treatment needs to be operated under a non-oxidized atmosphere environment, for example, under the gaseous of nitrogen, hydrogen, ammonia, argon, or the mixture of the above-mentioned gaseous. The operating temperature of the sintering treatment will affect the particle size of the phosphor. A phosphor with fine particle sizes can be obtained when sintered at a low temperature, and a phosphor with large particle sizes can be obtained when sintered at a high temperature. Preferably, the operating temperature of the sintering treatment is ranged from 1600~1800° C., and more preferably, the operating temperature of the sintering treatment is ranged from 1700~1800° C. Preferably, the heating rate is ranged from 3° C./min~15° C./min. The operating time of the sintering treatment varies according to the different ingredients in the raw materials. Preferably, the operating time is ranged from 1 hour~2 hours. Preferably, the operating pressure of the sintering treatment is under 0.5 MPa, and more preferably under 0.1 MPa. After the sintering treatment is completed, the phosphor of the invention is obtained, and the obtained phosphor can be further pulverized via ball milling or industrial pulverizing machines, followed by treatments of steps of water washing, filtering, drying, or sorting.

In order to obtain phosphor(s) with high brightness, the impurity content in the phosphor composition caused by factors of the addition of fluxing agent(s) when the phosphor is sintered, the impurity in the raw materials, the contamination in the treating process, and etc. should be as minimized as possible. Especially, when elements F, B, Cl, C, and etc. are existent in large amounts, illumination will be inhibited. Therefore, contamination can be prevented by choosing raw materials with high purity and controlling synthetic steps, such that the content of each of the above-mentioned elements is lower that 1000 ppm, respectively.

When the phosphor of the invention is utilized in powder form, the average particle size of the phosphor is preferably under 20 μm. The reason is that the illumination of phosphor powders mainly occurs on the surface of the particles, and if the average particle size (in the present invention, "average particle size" refers to volumetric mean particle size ($D_{50}$)) is under 20 μm, the surface area per unit weight of phosphor powders will be assured, thus the decrease of brightness is prevented. Besides, when the phosphor powders are coated on the light emitting element, the density of the phosphor powders can be increased. From the point of view, the decrease of brightness can also be prevented. In addition, according to the inventors' research, from the illumination efficiency of phosphor powders point of view, it is preferable that the average particle size is larger than 1 μm. According to the above-mentioned, the average particle size of the phosphor of the invention is preferably larger than 1 μm and smaller than 20 μm, and in particular preferably larger than 3.0 μm and smaller than 15 μm. The so-called average particle size ($D_{50}$) here is measured with Multisizer-3 by Beckman Coulter, Inc. utilizing Coulter counter method.

A composition analysis is carried out on the phosphor of the invention, and it is discovered that there is only minor deviations between the values of l, m, a, b, t, n, and r of the composition representing the contents of each element and the values of l, m, a, b, t, n, and r of the composition formula for feeding materials. The phenomenon can be interpreted as caused by decomposition of small amounts of ingredients, removal of small amounts of ingredients which did not entered the lattice of the phosphor by water washing, or analysis error. Especially, the deviation of the value of t may be caused by the oxygen adhered on the surface of each of the ingredients in the raw materials, the oxygen formed by oxidation of the surface of each of the ingredients in the raw materials when the raw materials of the phosphor are in the weighing, mixing, or sintering process, or the moisture or oxygen adhered on the surface of the as-formed phosphor after the sintering treatment. Besides, when the sintering treatment is operated under a nitrogen and/or ammonia-containing environment, the oxygen of the each of the ingredients of the raw materials may disengage and be replaced by nitrogen, which leads to the minor deviation of the value of t.

Figure 1:
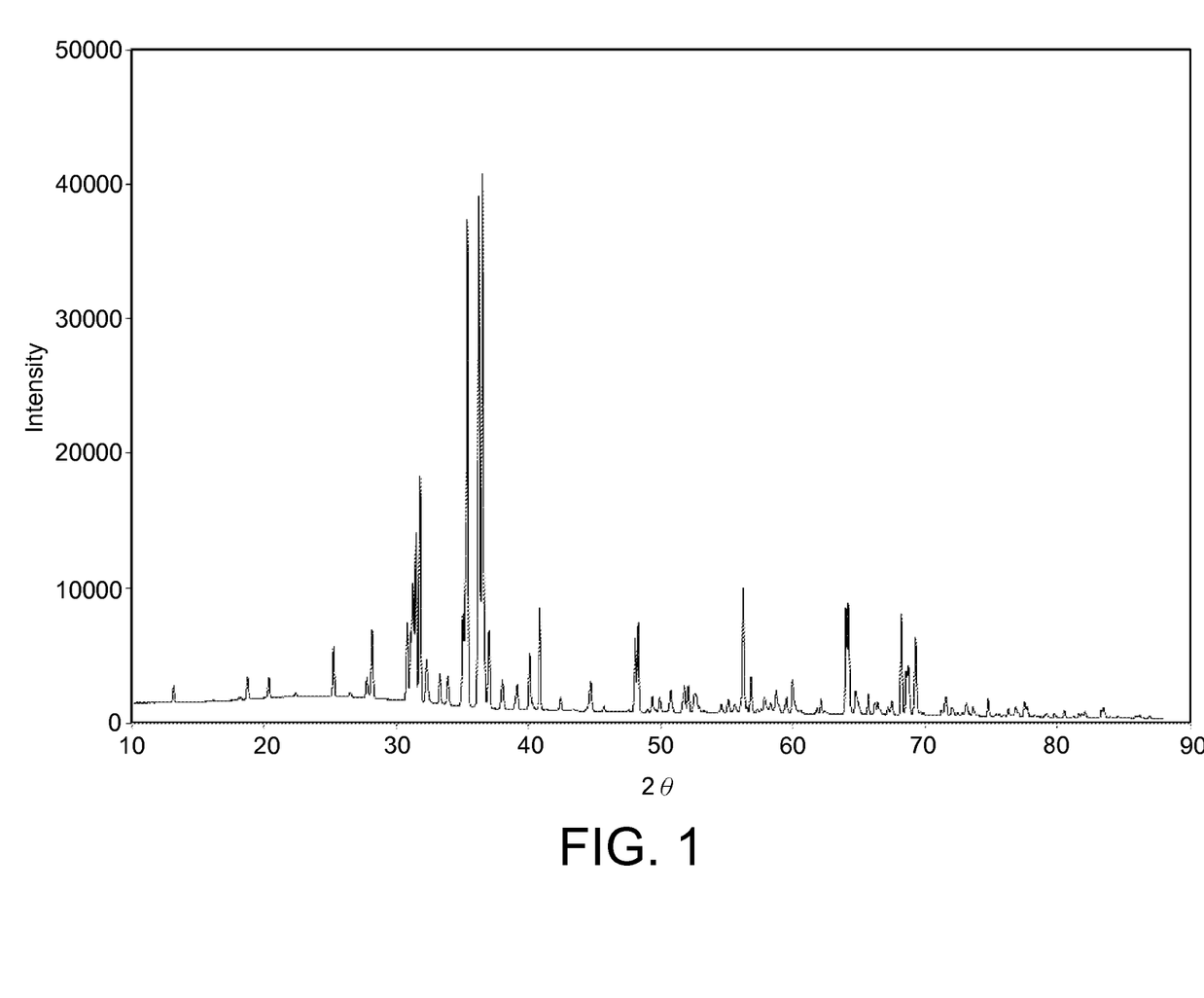
FIG. 1 is X-ray powder diffraction pattern of example 1

Accordingly, the present invention makes luminous brightness and the retention rate of the brightness of the phosphor are maintained in a better condition compared to prior conventional phosphors by adjusting the ratio of each element in the composition and complying m+r=1 and 1.15<b/a<1.4. Through the X-ray powder diffraction pattern, as shown in FIG. 1, the ten strongest diffraction peaks are determined to be inconsistent with the conventional $CaAlSiN_3$. Besides, the lattice constants calculated from the results of X-ray diffraction are different from that of the conventional $CaAlSiN_3$. Therefore, it is determined that the present invention is different from the conventional phosphor.

The inventors are not certain about the reason(s) causing the increase of brightness of the light emitted from the phosphor, however, the inventors speculate that due to the appropriate addition of alkali metal(s) and the adjusting of ratios of other elements, the solid solubility between the elements is increased. Therefore, the crystal structure of the phosphor becomes intact. Lattice defects of the phosphor of example are less than that of the red phosphor of the current technology. In addition, energy transfer efficiency becomes high. Thus, the illumination efficiency of the phosphor and the brightness is high. Also, because lattice defects are decreased, the molecular structure is intact. Therefore, the retention rate of the brightness of molecules can be maintained in a good level. In summary, the present invention is a novel phosphor with high brightness and retention rate of the brightness at the same time.

The phosphor of the present invention is applicable to vacuum fluorescent displays (VFD), field emission displays (FED), plasma display panels (PDP), cathode ray tubes (CRT), light emitting diodes, and etc.

The light emitting device of the present invention comprises a light emitting unit of a light emitting element and a phosphor as described above. The phosphor is excited by a light emitted from the light emitting element and emits a light different from the exciting light.

Preferably, the light emitting elements can be semiconductors of materials of zinc sulfide or gallium nitride, and more preferably gallium nitride for illumination efficiency. The gallium nitride can be formed on the substrate via metal-organic chemical vapor deposition (MOCVD) or hydride vapor phase epitaxy (HYPE). The light emitting element formed from $In_\alpha Al_\beta Ga_{1-\alpha-\beta}N$ ($0 \le \alpha$, $0 \le \beta$, $\alpha+\beta<1$) is most preferable.

Preferably, the light emitted from the light emitting element of the light emitting device has a wavelength of 300~550 nm. More preferably, the emitted light has a wavelength of 330~550 nm.

Figure 3:
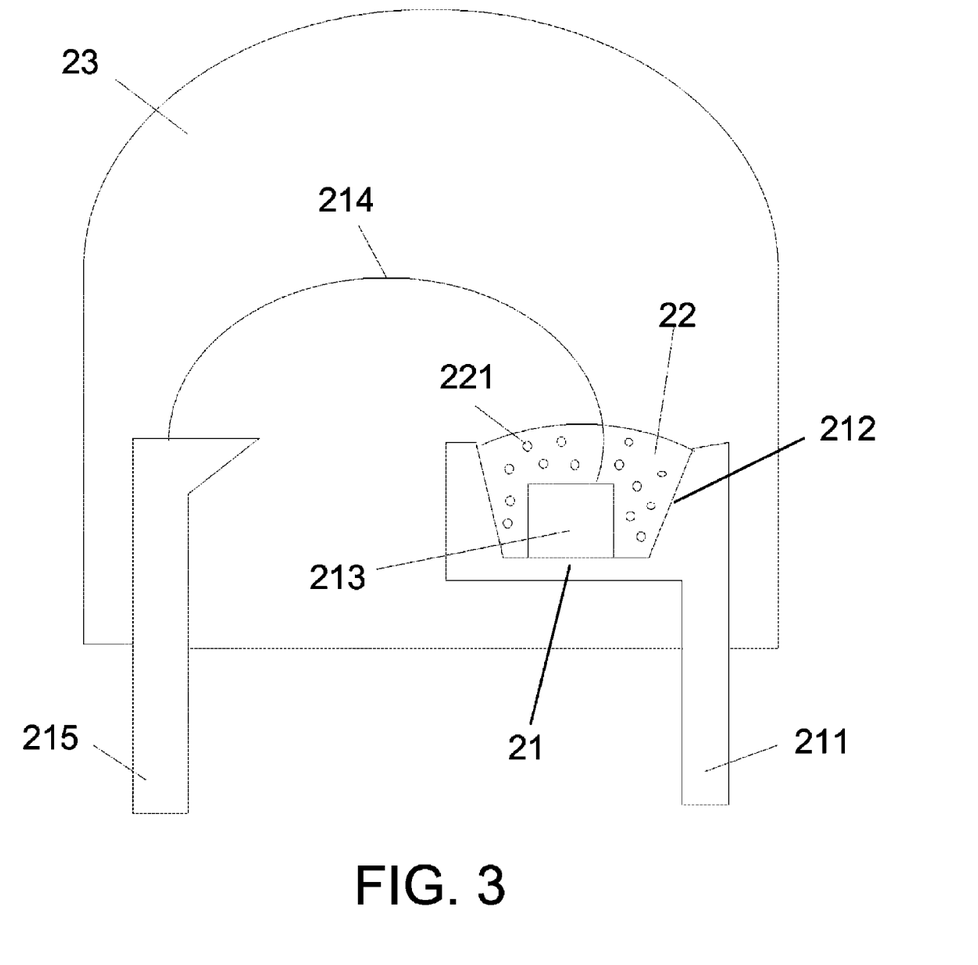
FIG. 3 is perspective view of an example of the light emitting device of the invention.
Figure 4:
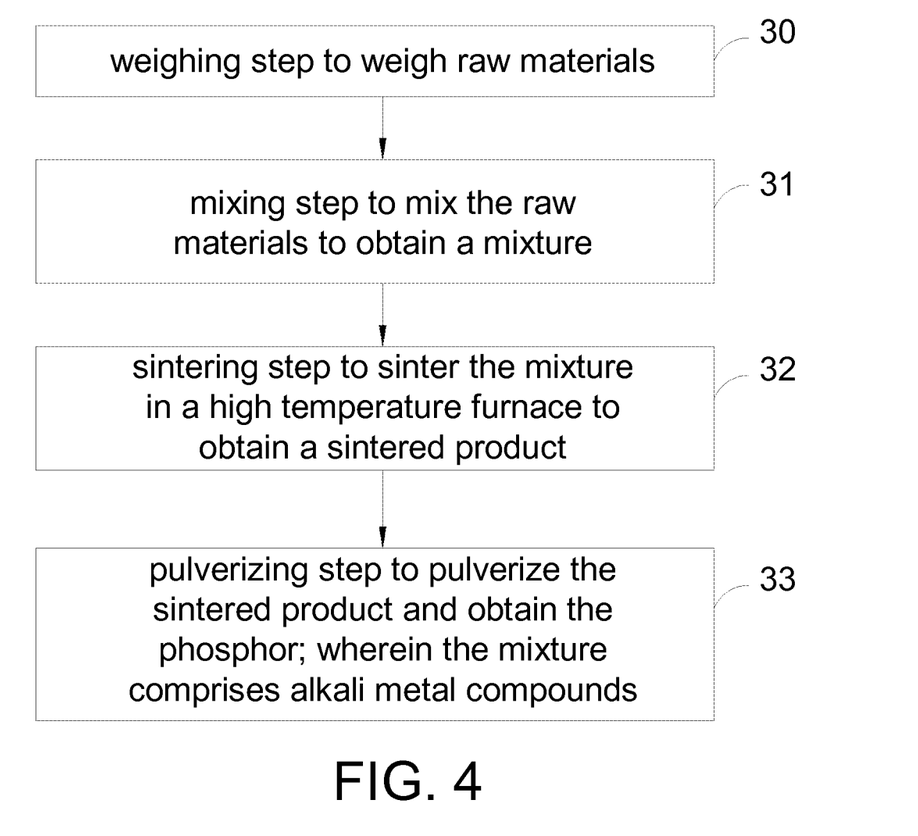
FIG. 4 is a flowchart of the manufacturing process of a phosphor of the invention.

Referring to FIG. 3, the light emitting device of an example of the invention comprises a light emitting unit 21, a fluorescence layer 22, and an encapsulating layer 23.

The light emitting unit 21 comprises a conductive base 211 having a concave bearing surface 212, a light emitting element 213 disposed in the concave bearing surface 212 and electrically connected to the base 211, a connecting wire 214 electrically connected to the light emitting element 213, a conducting wire 215 electrically connected to the connecting wire 214. The base 211 and the conducting wire 215 can cooperate to supply external electrical energy to the light emitting element 213. The light emitting element 213 can convert the electrical energy to light energy and emit it out. An example of the invention is to adhere a commercial available InGaN light emitting element 213 (Chi Mei Lighting Technology Corp.) of light emitting wavelength of 455 nm on the concave bearing surface 212 of the base 211 with a conductive silver paste (BQ6886, Uninwell International), and then the connecting wire 214 electrically connected to the light emitting element 213 and the conducting wire 215 are extended from the top surface of the light emitting element 213.

The fluorescence layer 22 covers the light emitting element 213. After the phosphors 221 contained in the fluorescence layer 22 are excited by the light emitted from the light emitting element 213, the phosphors 211 converts the light emitted from the light emitting element 213 to emit a light different from the exciting light. In the example, the fluorescence layer 22 is formed by coating a polysiloxane resin with the phosphors 211 contained therein on the external surface of the light emitting element 213 followed by drying and hardening.

The encapsulating layer 23 covers a part of the base 211 of the light emitting unit 21, connecting wire 214, a part of the conducting wire 215, and the fluorescence layer 22.

In the light emitting device of the invention, the phosphor of the invention can either be used independently or by cooperating with phosphors of other light emitting characteristics, such that a light emitting device capable of emitting desired colors of light is constructed.

For example, an ultraviolet light emitting element of 330 nm-420 nm, a blue phosphor emitting light of 420 nm-500 nm (such as $BaMgAl_{10}O_{17}$:Eu), a green phosphor emitting light of 500 nm-570 nm (such as β-sialon phosphor), and the phosphor of the invention are assembled to manufacture a light emitting device. Red light, green light, and blue light will be emitted respectively when the phosphors are illuminated by the ultraviolet light emitted from the light emitting element, and the lights will be mixed with the ultraviolet light emitted from the light emitting element to become a white light emitting device (such as a light apparatus, a light emitting diode, and etc.).

In addition, for example, a blue light emitting element of 420 nm~5000 nm, a yellow phosphor emitting light of 550 nm~600 nm (such as $Y_3Al_5O_{12}$:Ce), and the phosphor of the invention are assembled to manufacture a light emitting device. Red light and yellow light will be emitted respectively when the phosphors are illuminated by the blue light emitted from the light emitting element, and the lights will be mixed with the blue light emitted from the light emitting element to become a white light emitting device (such as a light apparatus, a light emitting diode, and etc.).

The invention is illustrated with the following examples and comparative examples. It is to be understood that the examples are used for exemplification and not limited thereto.

EXAMPLE AND COMPARATIVE EXAMPLE

Description of Measurement Methods:

(1) Brightness and chromaticity coordinates of phosphor(s): The phosphor is illuminated with a light of 455 nm, and then the brightness of the phosphor and the chromaticity coordinates are measured with a TOPCON brightness meter (SR-3A). The variance of the brightness measured values is within ±0.3%.

(2-1) Retention rate of the brightness of phosphor(s): [(brightness of the same phosphor after heated))/(brightness of the same phosphor before heated)]×100%.

(2-2) Heating procedure for the retention rate of the brightness of phosphor(s): A sample of about 2 grams is taken to be placed in a boron nitride crucible with a maintained circulation of air from outside, followed by heated to 600° C. at a heating rate of 10° C./min, held at the temperature for 30 minutes, and then cooled to room temperature at a cooling rate of 10° C./min.

(3) Composition analysis of phosphor(s):

(3-1a) Instrument: The measurement is carried out with inductively coupled plasma atomic emission spectrometer (ICP) (ULTIMA-2 type, Jobin Yvon Technology).

(3-1b) Pretreatments of sample(s): A sample of 0.1 grams is accurately weighed and taken to be placed in a platinum crucible, added with 1 grams of $Na_2CO_3$ and mixed uniformly, and then fused in a 1200° C. high temperature furnace (temperature condition: temperature is raised from room temperature to 1200° C. in 2 hours and stays at 1200° C. for 5 hours). The fusion product is then cooled and added into an acid solution, such as 25 ml HCl (36%), and then heated to be dissolved until the solution is clear. The solution is then placed into a 100 mL PFA volumetric flask after cooled and quantitatively added with pure water to the marked line of the flask.

(3-2a) Instrument: Nitrogen and Oxygen analyzer (Horiba Ltd., EMGA-620W).

(3-2b) Measurement: 20 mg of the phosphor is placed into a Sn capsule, and then the capsule is placed in a crucible to be measured.

(4) Analysis of average particle size $D_{50}$ of phosphor(s): The measurement is carried out with Beckman Coulter Multisizer-3. $D_{50}$ represents that the cumulative volume of particles with particle sizes smaller than the value is 50% of the total volume of all particles.

(5) Analysis of lattice constants: Beamline BL01C2 in National Synchrotron Radiation Research Center. The energy of the beamline is 14 keV, the scanning range (2θ) is 0~90°, the detector is Mar345 Imaging Plate Area Detector, and the exposure time is below 60 seconds.

Example 1

0.05 moles of lithium carbonate ($Li_2CO_3$) compound, 0.15 moles of calcium nitride ($Ca_3N_2$) compound, 0.1806 moles of strontium nitride ($Sr_3N_2$) compound, 0.95 moles of aluminum nitride (AlN, purity of 3N), 0.433 moles of silicon nitride ($Si_3N_4$, purity of 3N), and 0.004 moles europium oxide ($Eu_2O_3$, purity of 4N) are weighed and mixed using a crucible in a glove box under nitrogen, so that a raw material of the phosphor is formed.

The raw material of the phosphor is placed in a sintering container made of boron nitride, followed by placing the sintering container with the raw material therein in a high temperature furnace with highly pure nitrogen atmosphere. The gas flow rate of the nitrogen is 80 liter/min. The temperature is raised to 1800° C. at a heating rate of 10° C./min and maintained at 1800° C. for 12 hours, and the operating pressure of the high temperature furnace is maintained at 0.1 MPa to proceed the sintering. After the sintering, the temperature is cooled to room temperature at a cooling rate of 10° C./min, followed by steps of pulverizing, ball milling, drying, and sorting, so that the phosphor is obtained.

The average particle size ($D_{50}$) of the phosphor is 7.5 μm. With a x-ray powder diffraction (XRD) experiment, the powder diffraction pattern is as shown in FIG. 1, the phosphor is calculated to be monoclinic, and the lattice constants are a=15.0025, b=5.6472, c=11.3525, and β=100.2316°.

The phosphor is analyzed with nitrogen and oxygen analyzer and inductively coupled plasma atomic emission spectrometer, and the composition is Li: 0.36 wt %, Ca: 10.23 wt %, Sr: 26.93 wt %, Al: 14.42 wt %, Si: 20.39 wt %, Eu: 0.69 wt %, N: 26.31 wt %, and O: 0.67 wt %. According to the above results, the chemical formula of the phosphor can be determined by calculation to be $Li_{0.091}Ca_{0.450}Sr_{0.542}Al_{0.942}Si_{1.28}N_{3.312}O_{0.074}$:$Eu_{0.008}$.

Examples 2~4 and Comparative Examples 1~3

The same steps are adopted to prepare the phosphors in examples 2~4 and comparative examples 1~3 as in example 1, and the difference is in the change of the usage quantity of $Si_3N_4$. The compositions are listed in Table 1. According to the experimental results in Table 1, it is shown that when the compositions of the phosphors complying 1.15<b/a<1.4, and the luminous brightness and the retention rate of the brightness of the phosphor can be maintained in a relatively preferable condition. From the results of comparative examples 1~2, it is shown that although the compositions of the phosphors comply the range, the luminous brightness can still be maintained in a good condition, as the ratio of b/a is larger than 1.4, the retention rate of the brightness decreases significantly. In comparative example 3, the ratio of b/a is smaller than 1.15, therefore, although the retention rate of the brightness can still be maintained in a good condition, the brightness decreases significantly. From the above-mentioned experimental results, it is shown that only the composition of the phosphor complies with the claimed range and 1.15<b/a<1.4, the luminous brightness and the retention rate of the brightness both are maintained in a preferable condition at the same time.

Example 5 and Comparative Examples 4~8

The similar steps as in example 1 are adopted to prepare the phosphors in examples 5 and comparative examples 4~8, and the difference is in the usage quantities of each of the compounds. The composition formulae of the phosphors and the experimental results are listed in Table 2. According to the experimental results in Table 2, it is shown that when the compositions of the phosphors comply with the claimed range, the luminous brightness and the retention rate of the brightness can be maintained in a relatively high performance. Although the values of b/a in comparative examples 4 and 6 comply with the claimed range, as the value of a is not smaller than 1, the retention rate of the brightness decreases significantly. The values of b/a and a in comparative examples 5, 7, and 8 do not comply the claimed range, therefore, the brightness and the retention rate of the brightness are relative poor. And, the value of Li in comparative example 7 exceeds the claimed range, so the retention rate of the brightness drops very significantly. From the above-mentioned experimental results, it is shown that only the composition of the phosphor complies with the claimed range and 1.15<b/a<1.4, the luminous brightness and the retention rate of the brightness both are maintained in a preferable condition at the same time.

Examples 6~9 and Comparative Examples 9~10

The similar steps are adopted to prepare the phosphors in examples 6~9 and comparative examples 9~10 as in example 1, and the difference is in the usage quantities of each of the compounds. The composition formulae of the phosphors and the experimental results are listed in Table 3. Although the composition in comparative example 9 comply 1.15<b/a<1.4, as element I is not added, thus the brightness decreases significantly. In comparative example 10, the addition of Li is in excess, and the value of b/a does not comply the claimed range, so the retention rate of the brightness decreases significantly. From the experimental results in Table 3, it is shown that only the composition of the phosphor complies with the claimed range, the luminous brightness and the retention rate of the brightness both are maintained in a preferable condition at the same time.

Examples 10~13

The similar steps are adopted to prepare the phosphors in examples 10~13 as in example 1, and the difference is in the change of the usage quantity of element M and element Z. The composition formulae of the phosphors and the experimental results are listed in Table 4.

Examples 14~15

The same steps are adopted to prepare the phosphors in examples 14~15 as in example 1, and the difference is in the change of the source and types of element I. 0.033 moles of lithium nitride compound is used in example 14, and 0.05 moles of potassium carbonate compounds is used in example 15. The composition formulae of the phosphors and the experimental results are listed in Table 5.

Examples 16~19

The similar steps are adopted to prepare the phosphors in examples 16~19 as in example 1, and the difference is in the change of the sources of element I and element O. The sources of element I and element O can be provided from the same compound or different compounds. In example 16~19, Li metal is used for element I, element O is provided by aluminum oxide, and aluminum nitride and aluminum oxide are used for element A. The usage contents of element A in each of the examples are as follows: 0.920 moles of AlN and 0.015 moles of $Al_2O_3$, 0.850 moles of AlN and 0.05 moles of $Al_2O_3$, 0.720 moles of AlN and 0.115 moles of $Al_2O_3$, 0.580 moles of AlN and 0.185 moles of $Al_2O_3$. The composition formulae of the phosphors and the experimental results are listed in Table 6.

Examples 20~21 and Comparative Example 11

The similar steps are adopted to prepare the phosphors in examples 20~21 and comparative examples 11 as in example 1, and the difference is in the change of the constant temperature during sintering. The temperature is 1700° C. in example 21, 1600° C. in example 22, and 1500° C. in comparative example 11. The usage contents and the experimental results are listed in Table 7. From the experimental results in the table, it is shown that the sintering temperature has a significant effect on the illumination properties. The preferable sintering temperature of the invention is 1600~1800° C.

In conclusion, the characteristics of high brightness and high retention rate of brightness of the phosphor of the invention is beyond what the phosphors of the same system of the current technology can achieve, and the phosphor is contributive to improve the color rendering property and color saturation of the white light emitted from white light emitting devices for providing the industry as another choice. Therefore, goal of the present invention is actually achieved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

TABLE 1

|  |  | Example 1 | Example 2 | Example 3 | Example 4 | Comparative example 1 | Comparative example 2 | Comparative example 3 |
|---|---|---|---|---|---|---|---|---|
| Composition elements of the phosphor | Li | 0.1 | 0.1 | 0.1 | 0.1 | 0.1 | 0.1 | 0.1 |
|  | Ca | 0.45 | 0.45 | 0.45 | 0.45 | 0.45 | 0.45 | 0.45 |
|  | Sr | 0.542 | 0.542 | 0.542 | 0.542 | 0.542 | 0.542 | 0.542 |
|  | Al | 0.95 | 0.95 | 0.95 | 0.95 | 0.95 | 0.95 | 0.95 |
|  | Si | 1.30 | 1.25 | 1.17 | 1.12 | 1.35 | 1.42 | 1.06 |
|  | O | 0.062 | 0.062 | 0.062 | 0.062 | 0.062 | 0.062 | 0.062 |
|  | N | 3.35 | 3.28 | 3.17 | 3.11 | 3.41 | 3.48 | 3.03 |
|  | Eu | 0.008 | 0.008 | 0.008 | 0.008 | 0.008 | 0.008 | 0.008 |
|  | b/a | 1.37 | 1.31 | 1.23 | 1.18 | 1.42 | 1.47 | 1.12 |
| Chromaticity coordinates | x | 0.649 | 0.650 | 0.651 | 0.652 | 0.647 | 0.646 | 0.653 |
|  | y | 0.349 | 0.348 | 0.347 | 0.346 | 0.350 | 0.350 | 0.345 |
| Brightness |  | 113 | 108 | 107 | 105 | 113 | 109 | 98 |
| Retention rate of the brightness |  | 90 | 94 | 94 | 95 | 85 | 82 | 95 |

TABLE 2

|  |  | Example 5 | Comparative example 4 | Comparative example 5 | Comparative example 6 | Comparative example 7 | Comparative example 8 |
|---|---|---|---|---|---|---|---|
| Composition elements of the phosphor | Li | 0.1 | 0.11 | 0.22 | 0.12 | 0.49 | 0.05 |
|  | Ca | 0.45 | 0.39 | 0.33 | 0.38 | 0.18 | 0.42 |
|  | Sr | 0.542 | 0.602 | 0.661 | 0.611 | 0.808 | 0.572 |
|  | Al | 0.9 | 1.11 | 1 | 1 | 1 | 1 |
|  | Si | 1.25 | 1.50 | 1.44 | 1.25 | 1.99 | 1.12 |
|  | O | 0.062 | 0.079 | 0.124 | 0.075 | 0.263 | 0.037 |
|  | N | 3.23 | 3.77 | 3.58 | 3.33 | 4.31 | 3.16 |
|  | Eu | 0.008 | 0.008 | 0.009 | 0.01 | 0.012 | 0.008 |
|  | b/a | 1.39 | 1.35 | 1.44 | 1.25 | 1.99 | 1.12 |
| Chromaticity coordinates | x | 0.648 | 0.629 | 0.645 | 0.633 | 0.622 | 0.635 |
|  | y | 0.35 | 0.364 | 0.352 | 0.36 | 0.371 | 0.358 |
| Brightness |  | 110 | 109 | 114 | 100 | 108 | 93 |
| Retention rate of the brightness |  | 92 | 72 | 63 | 75 | 41 | 70 |

TABLE 3

|  |  | Example 6 | Example 7 | Example 8 | Example 9 | Comparative example 9 | Comparative example 10 |
|---|---|---|---|---|---|---|---|
| Composition elements of the phosphor | Li | 0.006 | 0.06 | 0.15 | 0.2 | 0 | 0.3 |
|  | Ca | 0.45 | 0.45 | 0.45 | 0.45 | 0.45 | 0.45 |
|  | Sr | 0.542 | 0.542 | 0.542 | 0.542 | 0.542 | 0.542 |
|  | Al | 0.99 | 0.97 | 0.93 | 0.9 | 1 | 0.85 |
|  | Si | 1.35 | 1.32 | 1.28 | 1.25 | 1.35 | 1.35 |
|  | O | 0.015 | 0.042 | 0.087 | 0.112 | 0.012 | 0.162 |
|  | N | 3.45 | 3.39 | 3.29 | 3.23 | 3.46 | 3.31 |
|  | Eu | 0.008 | 0.008 | 0.008 | 0.008 | 0.008 | 0.008 |
|  | b/a | 1.36 | 1.36 | 1.38 | 1.38 | 1.35 | 1.58 |
| Chromaticity coordinates | x | 0.65 | 0.649 | 0.647 | 0.644 | 0.651 | 0.642 |
|  | y | 0.347 | 0.349 | 0.351 | 0.353 | 0.346 | 0.355 |
| Brightness |  | 100 | 106 | 114 | 115 | 91 | 110 |
| Retention rate of the brightness |  | 93 | 92 | 91 | 90 | 94 | 87 |

TABLE 4

|  |  | Example 10 | Example 11 | Example 12 | Example 13 |
|---|---|---|---|---|---|
| Composition elements of the phosphor | Li | 0.1 | 0.1 | 0.1 | 0.1 |
|  | Ca | 0.65 | 0.2 | 0.45 | 0.45 |
|  | Sr | 0.342 | 0.792 | 0.546 | 0.538 |
|  | Al | 0.95 | 0.95 | 0.95 | 0.95 |
|  | Si | 1.3 | 1.3 | 1.3 | 1.3 |
|  | O | 0.062 | 0.062 | 0.062 | 0.062 |
|  | N | 3.35 | 3.35 | 3.35 | 3.35 |
|  | Eu | 0.008 | 0.008 | 0.004 | 0.012 |
|  | b/a | 1.37 | 1.37 | 1.37 | 1.37 |
| Chromaticity coordinates | x | 0.649 | 0.638 | 0.637 | 0.658 |
|  | y | 0.348 | 0.361 | 0.361 | 0.341 |
| Brightness |  | 102 | 145 | 123 | 102 |
| Retention rate of the brightness |  | 94 | 90 | 91 | 91 |

TABLE 5

|  |  | Example 14 | Example 15 |
|---|---|---|---|
| Composition elements of the phosphor | Li | 0.1 | 0.1 |
|  | Ca | 0.45 | 0.45 |
|  | Sr | 0.542 | 0.542 |
|  | Al | 0.95 | 0.95 |
|  | Si | 1.3 | 1.3 |
|  | O | 0.012 | 0.062 |
|  | N | 3.38 | 3.35 |
|  | Eu | 0.008 | 0.008 |
|  | b/a | 1.37 | 1.37 |
| Chromaticity coordinates | x | 0.656 | 0.643 |
|  | y | 0.342 | 0.352 |
| Brightness |  | 112 | 105 |
| Retention rate of the brightness |  | 90 | 82 |

TABLE 6

|  |  | Example 16 | Example 17 | Example 18 | Example 19 |
|---|---|---|---|---|---|
| Composition elements of the phosphor | Li | 0.1 | 0.1 | 0.1 | 0.1 |
|  | Ca | 0.45 | 0.45 | 0.45 | 0.45 |
|  | Sr | 0.542 | 0.542 | 0.542 | 0.542 |
|  | Al | 0.95 | 0.95 | 0.95 | 0.95 |
|  | Si | 1.3 | 1.3 | 1.3 | 1.3 |

TABLE 6-continued

|  |  | Example 16 | Example 17 | Example 18 | Example 19 |
|---|---|---|---|---|---|
|  | O | 0.107 | 0.212 | 0.407 | 0.617 |
|  | N | 3.32 | 3.25 | 3.12 | 2.98 |
|  | Eu | 0.008 | 0.008 | 0.008 | 0.008 |
|  | b/a | 1.37 | 1.37 | 1.37 | 1.37 |
| Chromaticity coordinates | x | 0.65 | 0.648 | 0.646 | 0.643 |
|  | y | 0.348 | 0.350 | 0.352 | 0.355 |
| Brightness |  | 113 | 113 | 110 | 104 |
| Retention rate of the brightness |  | 90 | 92 | 92 | 90 |

TABLE 7

|  |  | Example 20 | Example 21 | Example 22 |
|---|---|---|---|---|
| Composition elements of the phosphor | Li | 0.1 | 0.1 | 0.1 |
|  | Ca | 0.45 | 0.45 | 0.45 |
|  | Sr | 0.542 | 0.542 | 0.542 |
|  | Al | 0.95 | 0.95 | 0.95 |
|  | Si | 1.3 | 1.3 | 1.3 |
|  | O | 0.062 | 0.062 | 0.062 |
|  | N | 3.35 | 3.35 | 3.35 |
|  | Eu | 0.008 | 0.008 | 0.008 |
|  | b/a | 1.37 | 1.37 | 1.37 |
| Chromaticity coordinates | x | 0.649 | 0.648 | 0.645 |
|  | y | 0.349 | 0.35 | 0.353 |
| Brightness |  | 106 | 101 | 93 |
| Retention rate of the brightness |  | 84 | 78 | 62 |

What is claimed is:

1. A manufacturing method for a phosphor, comprising:
sintering a mixture to form the phosphor, wherein the mixture comprises:
an element I selected from a group consisting of Li, Na, and K;
an element M selected from the group consisting of Ca, Sr, Mg, Ba, Be, and Zn;
an element A selected from the group consisting of Al, Ga, In, Sc, Y, La, Gd, and Lu;
an element B selected from the group consisting of Si, Ge, Sn, Ti, Zr, and Hr;
an element O (oxygen element);
an element N (nitrogen element); and
an element Z selected from the group consisting of Eu and Ce, wherein
a mole of the element I:a mole of the element M:a mole of the element A:a mole of the element B:a mole of the element O:a mole of the element N:a mole of the element Z is i:m:a:b:t:n:r,
m+r=1, 0<i<0.25, 0<a<1, 0<b<2, 1.15<b/a<1.4, 0≤t≤0.7, 2.1≤n≤4.4, 0.001≤r≤0.095.

2. The manufacturing method for the phosphor according to claim 1, further comprising pulverizing the phosphor.

3. The manufacturing method for the phosphor according to claim 1, wherein 1.25<b/a<1.4.

4. The manufacturing method for the phosphor according to claim 1, wherein 0.001≤i≤0.2.

5. The manufacturing method for the phosphor according to claim 1, wherein the element M comprises elements Ca and Sr.

6. The manufacturing method for the phosphor according to claim 1, wherein the mixture comprises alkali metal carbonates providing the element I.

7. The manufacturing method for the phosphor according to claim 6, wherein the mixture comprises lithium carbonate or potassium carbonate.

8. The manufacturing method for the phosphor according to claim 1, wherein Sr is contained in an amount of more than 20% of the element M.

9. The manufacturing method for the phosphor according to claim 1, wherein a+0.5i=1.

10. The manufacturing method for the phosphor according to claim 1, wherein $0.1 \leq t \leq 0.7$.

11. The manufacturing method for the phosphor according to claim 1, wherein the element M is selected from the group consisting of Ca and Sr, the element A at least comprises Al, the element B at least comprises Si, and the element Z at least comprises Eu.

12. The manufacturing method for the phosphor according to claim 1, when excited, the CIE 1931 chromaticity coordinates (x, y) of the light emitted from the phosphor is $0.45 \leq x \leq 0.72$ and $0.2 \leq y \leq 0.5$.

13. The manufacturing method for the phosphor according to claim 1, wherein the sintering step is performed at 1600° C.~1800° C.

14. The manufacturing method for the phosphor according to claim 1, wherein the sintering step is performed at 1700° C.~1800° C.

15. The manufacturing method for the phosphor according to claim 1, wherein the sintering step is performed under a pressure of 1 atm.

16. A phosphor, wherein the phosphor is manufactured by the method according to claim 1.

17. A light emitting device, comprising:

a light emitting element; and a phosphor that is excited by a light emitted from the light emitting element and converts the light emitted from the light emitting element to emit a light different from the exciting light, wherein the phosphor is manufactured by the method according to claim 1.

* * * * *